United States Patent [19]

Ausschnitt

[11] Patent Number: 5,790,254
[45] Date of Patent: Aug. 4, 1998

[54] MONITORING OF MINIMUM FEATURES ON A SUBSTRATE

[75] Inventor: Christopher Perry Ausschnitt, Brookfield, Conn.

[73] Assignee: International Business Machines Corporation, Armonk, N.Y.

[21] Appl. No.: 670,469

[22] Filed: Jun. 26, 1996

Related U.S. Application Data

[62] Division of Ser. No. 359,797, Dec. 20, 1994, Pat. No. 5,629,772.

[51] Int. Cl.$^6$ ............................................. G01B 11/00
[52] U.S. Cl. ........................................ 356/372; 430/5
[58] Field of Search .......................... 356/342, 375, 356/376, 394, 121, 401; 430/5

[56] References Cited

U.S. PATENT DOCUMENTS

| | | | |
|---|---|---|---|
| 4,585,342 | 4/1986 | Lin et al. | 356/124 |
| 4,759,626 | 7/1988 | Kroko | 356/124 |
| 5,005,071 | 4/1991 | Amano | 356/372 |
| 5,256,505 | 10/1993 | Chen et al. | 430/5 |
| 5,418,613 | 5/1995 | Matsutani | 356/401 |

OTHER PUBLICATIONS

R. Dellaguardia, et al., "Comparison of Image Shortening Effects in X-ray and Optical Lithography" 1994 Beams Conference, J. Vac. Science Tech. B, to be published Nov./Dec. 1994.

D. S. Goodman, et al. "High Spatial Frequency MTF Measurement Scheme" IBM Technical Disclosure Bulletin, V. 25, #10, pp. 5056–5057, Mar. 1983.

C. P. Ausschnitt, Electrical Measurements for Characterizing Lithography VLSI Electronics, Microstructure Science, vol. 16, pp. 320–355, 1986.

T. A. Brunner, et al., "Quantitative Stepper Metrology Using the Focus Monitor Test Mask" SPIE Proceedings, San Jose, Ca., vol. 2197, Mar. 1994.

*Primary Examiner*—Hoa Q. Pham
*Attorney, Agent, or Firm*—Kris V. Srikrishnan

[57] ABSTRACT

A method of measuring bias of a minimum feature in a lithographic process uses creating an array of elements having a width and space corresponding to the minimum feature, and a length. The length change of the array element resulting from image shortening effect from a lithographic process is measured and the bias of the element in the width dimension is calculated. A test site having groups of array elements is described which facilitate automatic bias measurement of array lengths and separations and especially allows the use of non SEM metrology tools which is otherwise incapable of measuring the minimum feature width being monitored. Measurements by this method and test site used to control lithographic processing of substrates in manufacturing, routine monitoring of product substrates and lithographic tool and process for minimum bias, are disclosed.

3 Claims, 9 Drawing Sheets

Ln = NOMINAL LENGTH
LP = PRINTED LENGTH
Wn = NOMINAL WIDTH
WP = PRINTED WIDTH

MONITORING OF MINIMUM FEATURES ON A SUBSTRATE

This application is a divisional of Ser. No. 08/359,797 filed Dec. 20, 1994 now U.S. Pat. No. 5,629,772.

TECHNICAL FIELD

The present invention relates generally to manufacturing process requiring lithography and, more particularly, to monitoring of lithographic and etch processes used in microelectronics manufacturing.

BACKGROUND OF THE INVENTION

Lithography has a broad range of industrial applications, including the manufacture of semiconductors, flat-panel displays, micromachines, and disk heads.

The lithographic process allows for a mask or reticle pattern to be transferred via spatially modulated light (the aerial image) to a photoresist film on a substrate. Those segments of the absorbed aerial image, whose energy exceeds a threshold energy of chemical bonds in the photoactive component (PAC) of the photoresist material, create a latent image in the photoresist. In some photoresist systems the latent image is formed directly by the PAC; in others (so-called acid catalyzed photoresists), the photochemical interaction first generates acids which react with other photoresist components during a post-exposure bake to form the latent image. In either case, the latent image marks the volume of photoresist material that either is removed during the development process (in the case of positive photoresist) or remains after development (in the case of negative photoresist) to create a three-dimensional pattern in the photoresist film.

The principal determinant of the photoresist image is the surface on which the exposure energy equals the photoresist threshold energy in the photoresist film. "Exposure" and "focus" are the variables that control the shape of this surface. Exposure, set by the illumination time and intensity, determines the average energy of the aerial image per unit area. Local variations in exposure can be caused by variations in substrate reflectivity and topography. Focus, set by the position of the photoresist film relative to the focal plane of the imaging system, determines the decrease in modulation relative to the in-focus image. Local variations in focus can be caused by variations in substrate film thickness and topography.

Generally, because of the variations in exposure and focus, patterns developed by lithographic processes must be continually monitored or measured to determine if the dimensions of the patterns are within acceptable range. The importance of such monitoring increases considerably as the resolution limit, which is usually defined as minimum feature size resolvable, of the lithographic process is approached. The patterns being developed in semiconductor technology are generally in the shape of lines both straight and with bends, having a length dimension equal to and multiple times the width dimension. The width dimension, which by definition is the smaller dimension, is of the order of 0.1 micron to greater than 1 micron in many of the current leading semiconductor technology. Because the width dimension is the minimum dimension of the patterns, it is the width dimension that challenges the resolution limits of the lithographic process. In this regard, because width is the minimum and most challenging dimension to develop, it is the width dimension that is conventionally monitored to assess performance of the lithographic process. The term "bias" is used to describe the change in a dimension of a feature from its nominal value. Usually the bias of interest is the change in the smallest of the dimensions of a given feature. Further, the word "bias" is invariably used in conjunction with a process such as resist imaging, etching, developing etc. and described by terms such as image bias, etch bias, print bias etc.

Monitoring of pattern features and measurement of its dimensions (metrology) is typically performed using either a scanning electron microscope (SEM) or an optical tool. SEM metrology has very high resolving power and is capable of resolving features of the order of 0.1 micron. Unfortunately, SEM metrology is expensive to implement, relatively slow in operation and difficult to automate. Although optical metrology overcomes the above drawbacks associated with SEM metrology, optical metrology systems are unable to resolve adequately for measurement of feature dimensions of less than about 1 micron. Thus, optical metrology systems are unable to resolve state-of-the-art circuit line width dimensions, which are currently on the order of less than 1 micron.

Accordingly, there is still a need for a method of monitoring pattern features with dimensions on the order of less than 1 micron, and which is inexpensive to implement, fast in operation and simple to automate.

SUMMARY OF THE INVENTION

A method of measuring bias of a minimum feature in a lithographic process uses creating an array of elements having a width and space corresponding to the minimum feature, and a length. The length change of the array element resulting from image shortening effect from a lithographic process is measured and the bias of the element in the width dimension is calculated. A test site having groups of array elements is described which facilitate automatic bias measurement of array lengths and separations and especially allows the use of non SEM metrology tools which is otherwise incapable of measuring the minimum feature width being monitored. Measurements by this method and test site used to control lithographic processing of substrates in manufacturing, routine monitoring of product substrates and lithographic tool and process for minimum bias, are disclosed.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENT

The inventors have developed methods and procedures for monitoring features during lithography by extensively characterizing the phenomenon of "image shortening". As such, a brief discussion of the image shortening concept is provided hereinbelow to help understand the present invention.

Fundamentals of Image Shortening

Figure 1:
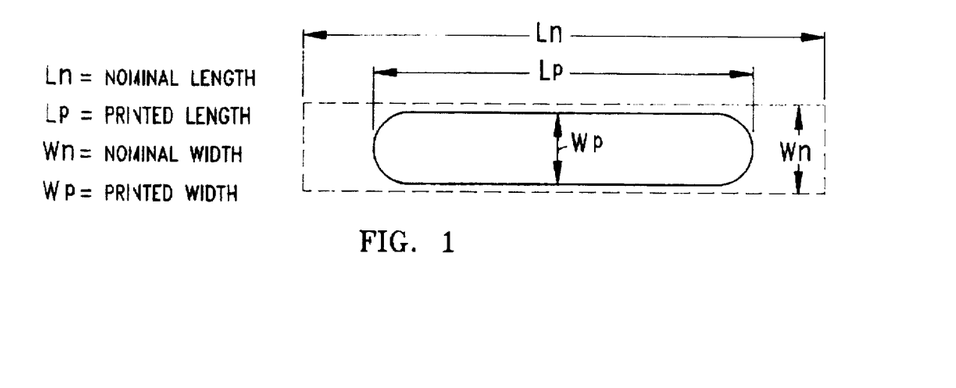
FIG. 1 is a schematic illustration of image shortening effect.

Referring to FIG. 1, for a line or space, whose nominal length ($L_n$) is greater than its nominal width ($W_n$), the pattern imaged by a lithography tool in photoresist will have printed dimensions $L_p$, $W_p$. Image shortening or foreshortening describes the case where the print bias of the length ($L_n - L_p$) exceeds the print bias of the width ($W_n - W_p$). The present inventor has found that the image shortening effect becomes pronounced as the resolution limit of the lithography tool/process is approached.

Figure 2A:
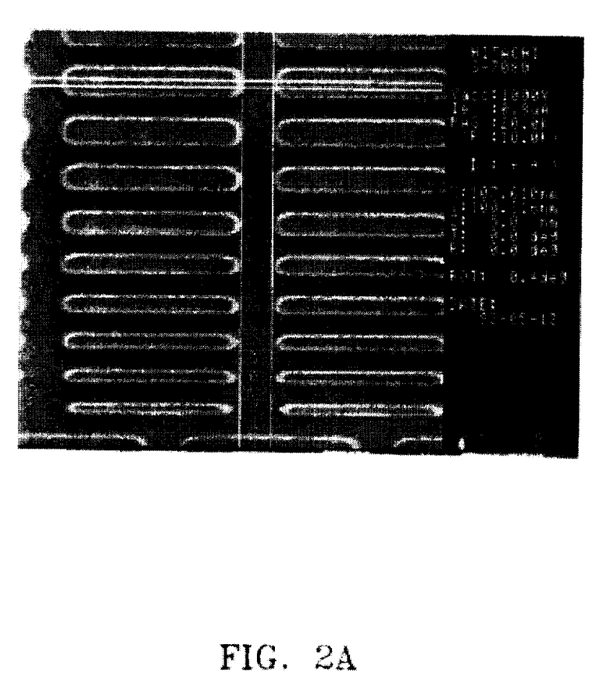
FIG. 2A is a top-down SEM photograph of lines illustrating the image shortening effect and FIG. 2B is a plot of measured separation data using test site of FIG. 2A.
Figure 2B:
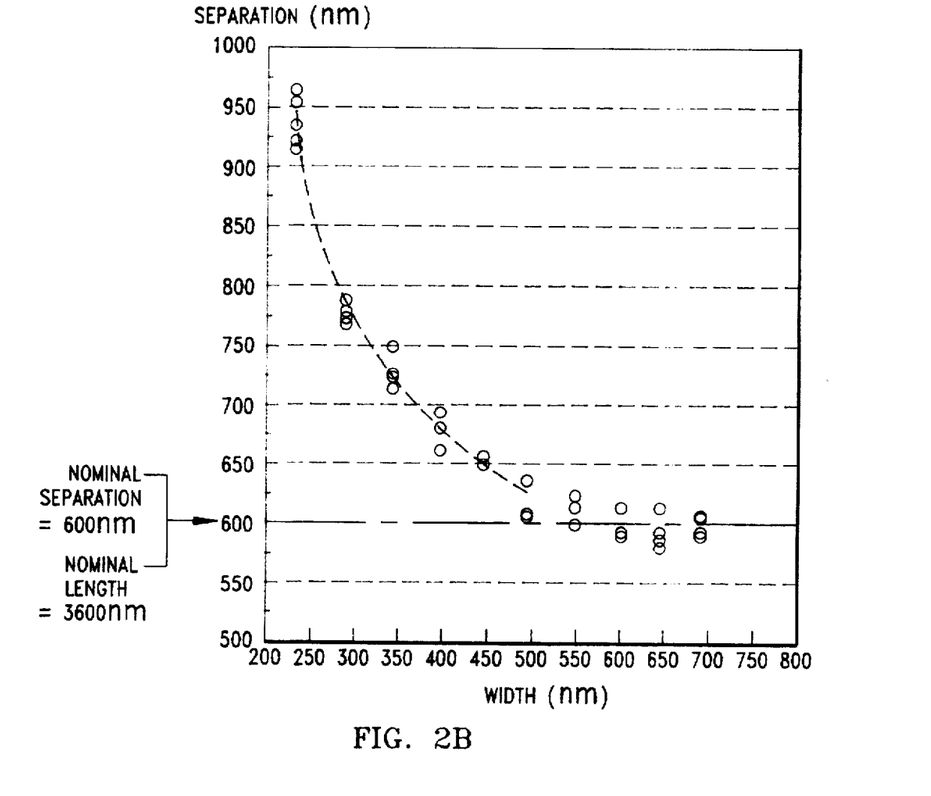
Figure 3:
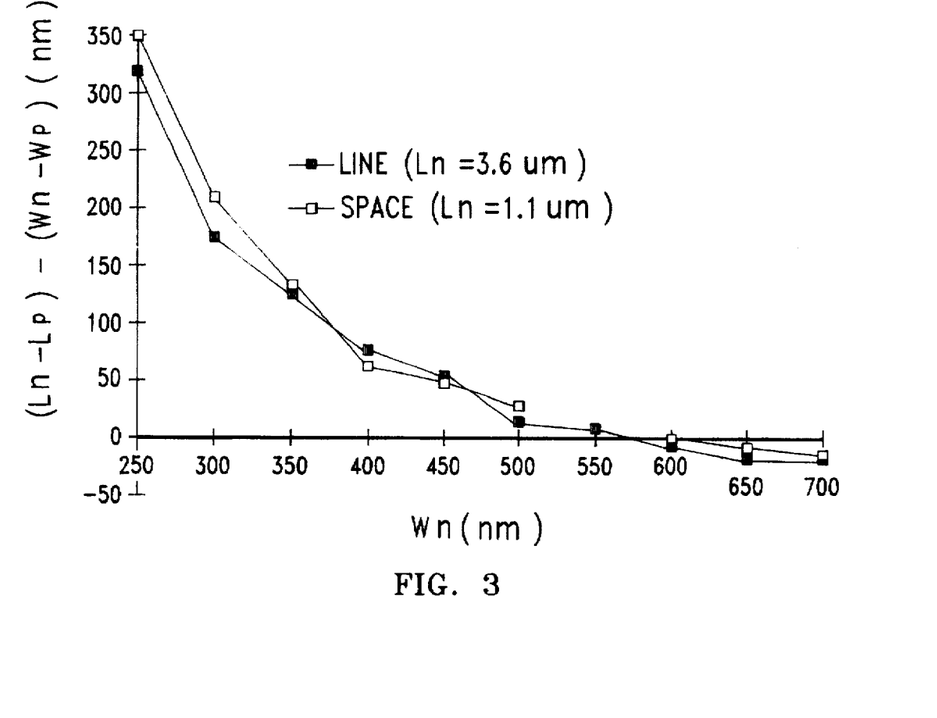
FIG. 3 is a plot of image shortening effect on a line and space as a function of its width.

FIG. 2A is a top-down SEM photograph of two arrays of lines used to characterize the image shortening effect. The array element widths varied over a wide range 250 nm to 700 nm that are part of the test pattern in FIG. 2A. The image shortening effect is measured in this case by the change in the separation between corresponding elements of the arrays, which is roughly the same as the change in line length. FIG. 2B is a plot of the experimental measurement of the image shortening as a function of minimum width of the feature from arrays such as shown in FIG. 2A. It can be observed that as the printed line width decreases from top to bottom of the photograph, the line ends deviate further from the parallel display cursors. It should be understood that at any width, the process conditions which includes exposure, focus and develop process can be adjusted to change the value of the image shortening. The plot of FIG. 3 illustrates that as the width of a line decreases, the bias of the length dimension actually increases over that of width or minimum feature bias. Accordingly, the present inventors have shown that length bias measurement can be advantageously used to characterize minimum feature bias in a lithographic process as the measurable quantity is larger and therefore easier to measure.

Factors Contributing to Image Shortening

Factors that contribute to image shortening include the following:

(1) The corners that must form the ends of the line or space contribute higher spatial frequency components relative to the middle of the line or space. Consequently, a given imaging system cannot resolve the ends as well as the middle, and a portion of the shortening is present in the aerial image.

(2) The photoactive compound (PAC) is the key chemical component for image formation in all photoresists. Diffusion of the PAC occurs within the photoresist film during expose and post-expose-bake processes. This diffusion will enhance the shortening as the width of the line or space approaches the diffusion length.

(3) The mask itself can contribute to shortening due to the resolution/process limitations inherent in mask patterning. These effects will be most severe for 1X masks, but can also be significant on 5X or 10X masks in the form of corner rounding and/or foreshortening on the mask. Corner rounding on the mask will enhance the shortening present in the aerial image of the lithography tool.

(4) Resist stress relief at develop could also lead to shortening effects.

Sensitivity to Exposure and Focus Variation

Figure 4A:
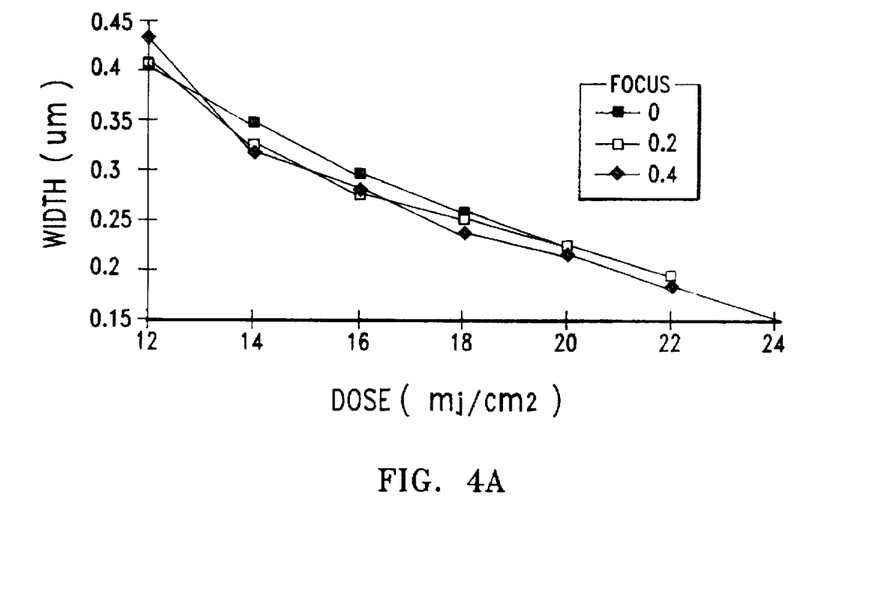
FIGS. 4A and 4B are plots of measured effect on width and length as a function of exposure dosage for different image focus.
Figure 4B:
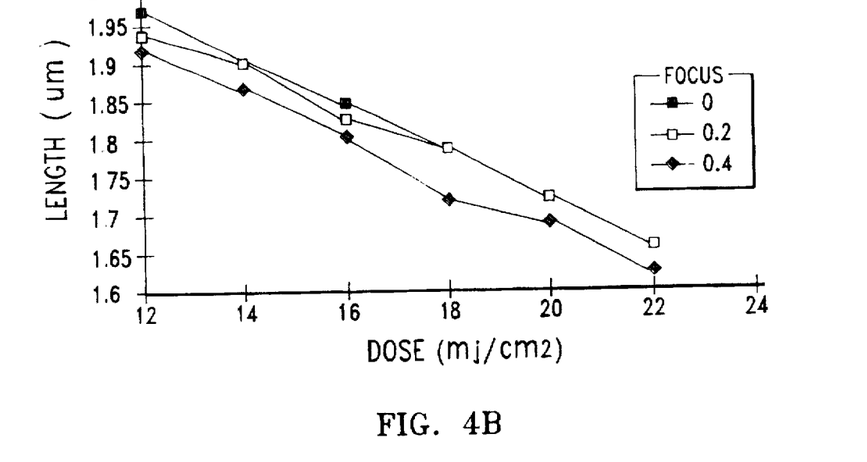

The present inventors have measured extensively the increased sensitivity of the length dimension to exposure and focus variation relative to the width dimension. For example, the experimental data in FIGS. 4A and 4B shows the effect of exposure dosage on the width and length dimension of a line for different focus conditions. From the data, comparing the dependence of the length dimension on exposure to that of the width, where the nominal linewidth is 250 nm and the nominal line length is 2 µm, it can be concluded that the sensitivity of the width bias to exposure (slope) is approximately 17 nm/mj/cm$^2$, and the sensitivity of the length bias to exposure (slope) is approximately 29 nm/mj/cm$^2$. Thus, the length shows approximately 1.7× greater sensitivity to exposure variation than does the width. For a given process, the magnitude of this sensitivity factor is dependent on factors that affect image shortening as described above.

Figure 5:
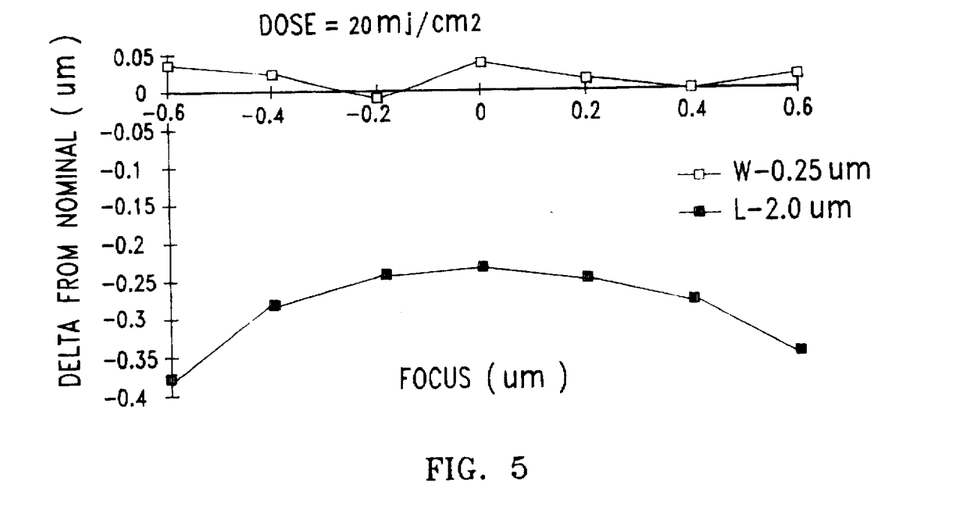
FIG. 5 is a plot of the effect of defocus on deviation in width and length from nominal values.
Figure 6:
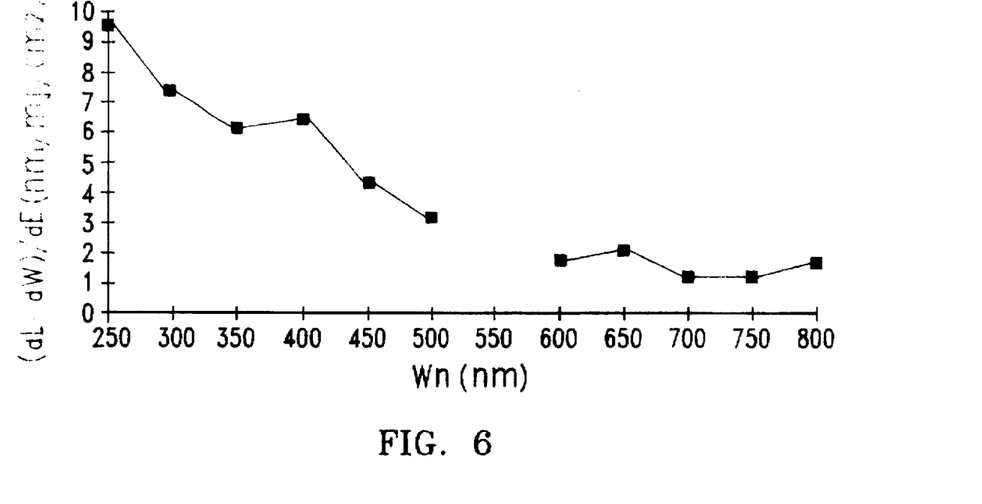
FIG. 6 is a plot of length-width sensitivity to exposure dosage.
Figure 7:
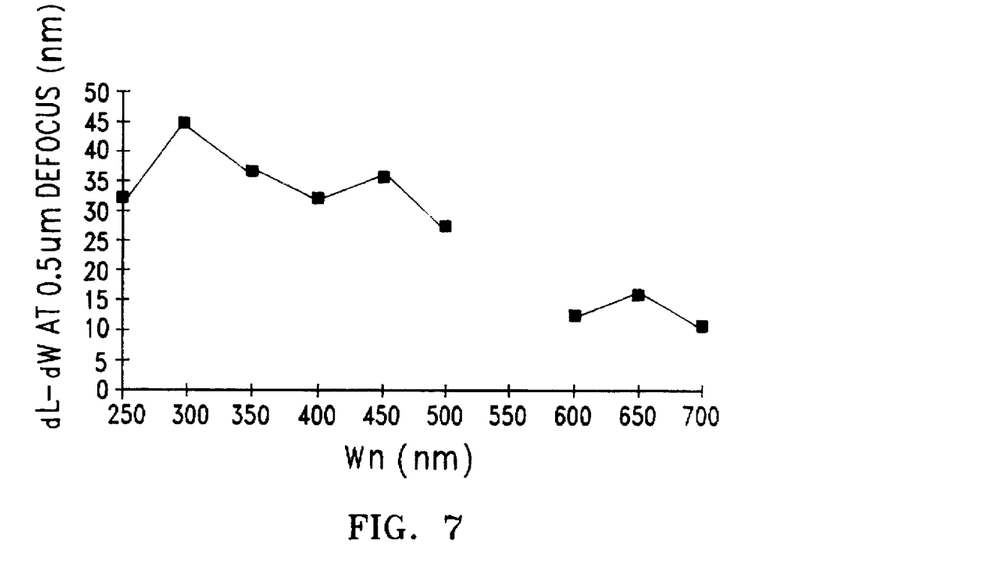
FIG. 7 is a plot of length-width sensitivity to defocus.

Further, as shown in FIG. 5, comparisons of the dependence of the length on focus to that of the width have also shown that the length shows significantly greater deviation from nominal with defocus. FIG. 6 shows the experimental data for an isolated trench of varying width and how the differential bias (length bias−width bias) sensitivity to exposure changes as a function of trench width. The data shows that length bias is at least equal or more sensitive to exposure than width bias and shows a trend with the minimum feature size. FIG. 7 shows a similar plot but this time, the defocus is varied. Again the experimental data shows that length bias is more sensitive and the width bias is predictable from length bias measurement.

Thus, it has been found that the length dimensions demonstrates greater sensitivity to exposure and focus than does the width dimension. The length sensitivity relative to the width increases as the nominal width decreases. As such, the higher sensitivity of the length relative to the width makes the length a more desirable dimension to monitor for the control of the lithographic patterning process. This is in contrast to conventional thinking and practice in which the width dimension has been measured for such control.

Problems with Length Measurement

Figure 8:
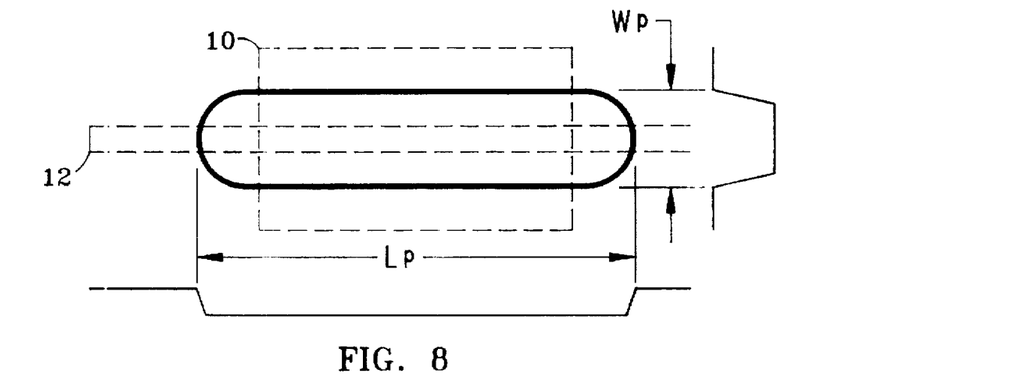
FIG. 8 is a schematic of a feature having a length and width dimension.

Reference is now made to FIG. 8. Length measurement poses a different set of problems than width measurement. In the width direction, the window 10 of the measurement tool can be set to integrate over a long length of the line or space pattern, as there exist many measurement pixels. In this case, the measurement obtained is insensitive to the positioning of the measurement window 10 relative to the pattern, particularly since the ends of the pattern, where tapering of the width occurs, can be avoided.

An equivalent length measurement would require setting the measurement window 12 to be much narrower than the pattern width. For narrow line or space patterns, for example, on the order of 250 nm, this means setting the measurement window 12 to be a relatively few pixels wide. In addition, the measurement obtained would be extremely sensitive to the positioning of the measurement window relative to the pattern, leading to a degradation of measurement precision and repeatability.

Critical Dimension Monitoring in Accordance with the Invention

In accordance with the invention, an improved method of determining and controlling the critical dimensions of patterns used in semiconductor device manufacturing is provided. In this method, measurements are performed on a test pattern that is uniquely related to device dimensions, imaging capability and measurement capability.

Figure 9:
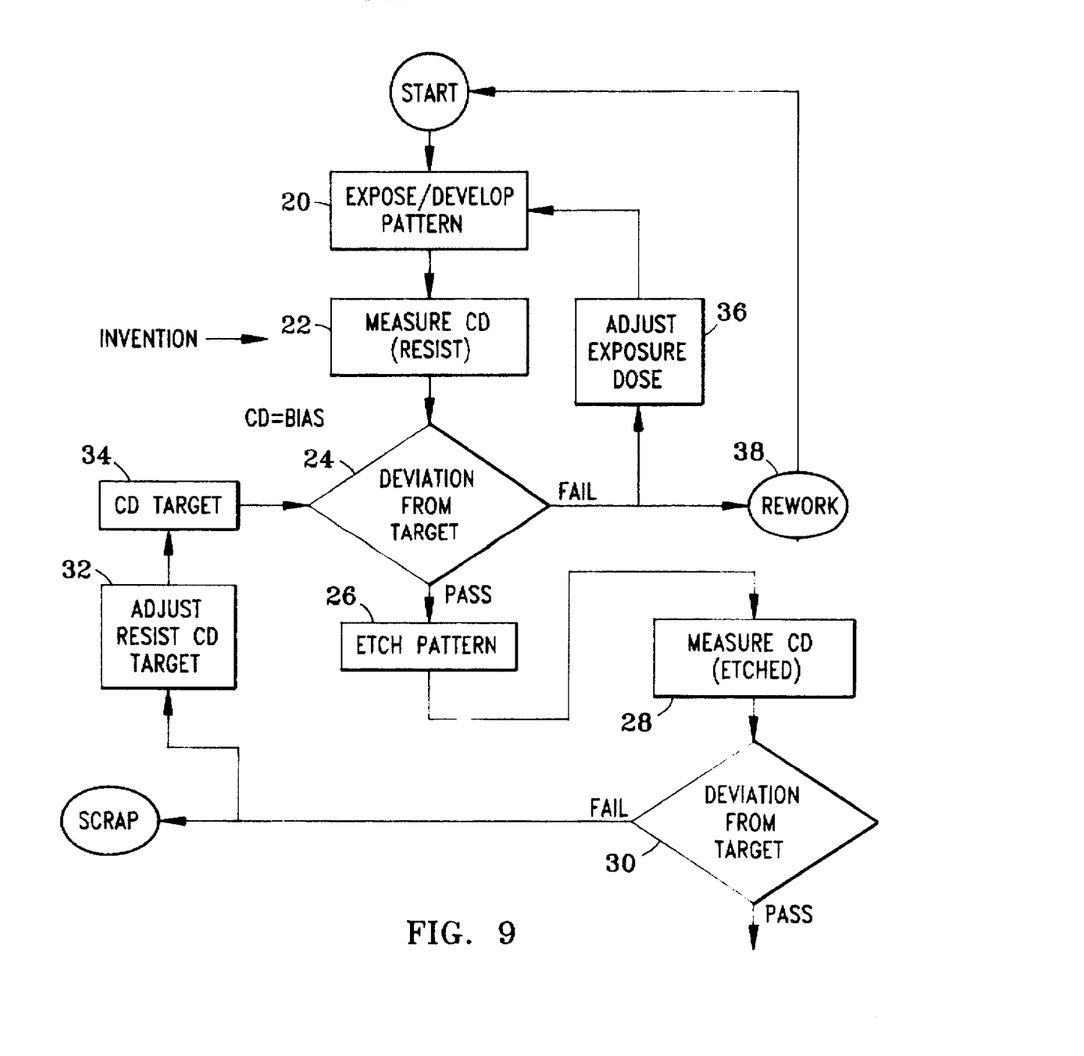
FIG. 9 is a flow chart of controlling lithography process by using bias (CD) measurement.

Referring now to FIG. 9, implementation of the invention will be described in the context of a typical lithography process using an optical stepper. At the START of the lithography process, at block 20, a wafer is coated with photoresist. The thickness of the photoresist is determined by the product imaging and etch requirements, and is typically in the range of 5,000 Å to 20,000 Å. A mask or reticle is then used to expose a pattern on the photoresist. The stepping pattern on the wafer is determined by the overall product pattern size and the image field size of the exposure tool. Typical image field sizes are greater than approximately 20,000 µm square. An appropriate image is projected onto the photoresist coated wafer, and developed so as to create a photoresist pattern. The nature of the wafer and process employed in the practice of the invention is dictated by the device being manufactured. Typical products have multiple pattern levels, with different patterns characterized by different design rules at each level. In accordance with the present invention, the photoresist pattern must contain one or more test pattern, which can be preferably located in an area of the image field outside of the product. The test pattern(s) will be described in greater detail hereinbelow.

Figure 10:
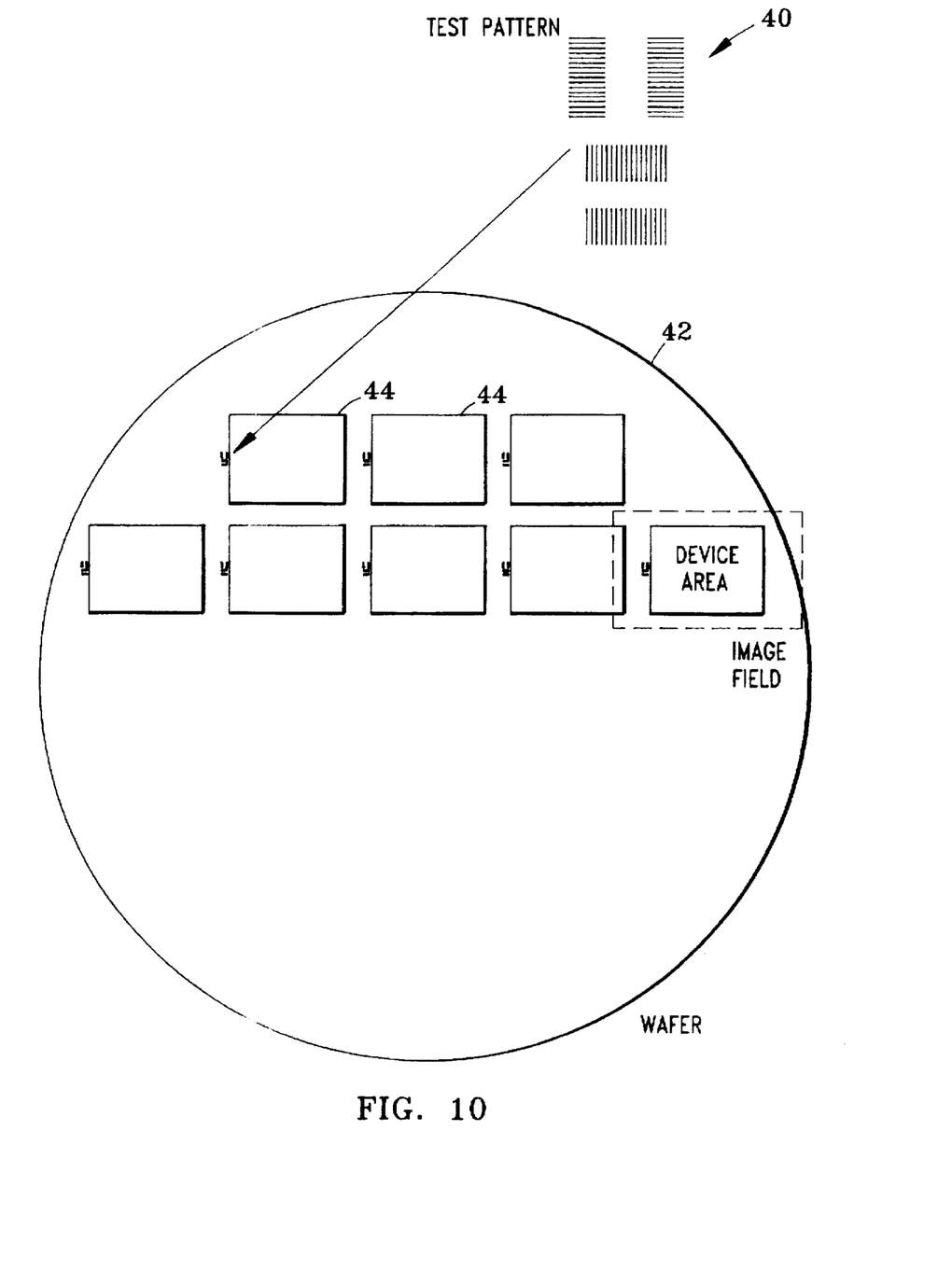
FIG. 10 is an implementation of a test pattern on a product wafer.

Referring now to FIG. 10, for product monitoring and control, the test pattern 40 must be printed in conjunction with the desired device pattern on the product wafer 42. To represent the product, the elements of the test pattern 40 should have a width and pitch smaller than or equal to (corresponding to) that of the most critical feature of the device pattern. Depending on the application, the test pattern 40 can contain a plurality of array lines, the minimum width and space of the arrays can be varied to cover a range of dimensions below and above the intended design minimum features or the minimum capability of the lithographic process and tool. At a minimum, at least one array of lines will constitute the test pattern. As shown in FIG. 10, the test patterns 40 can be distributed over any areas not occupied by the product patterns 44 and/or other requisite alignment and measurement patterns. Optionally, when resist/etch image characterization is the objective, similar test patterns of varying line width and pitch can be distributed throughout the image field and wafer.

Figure 11:
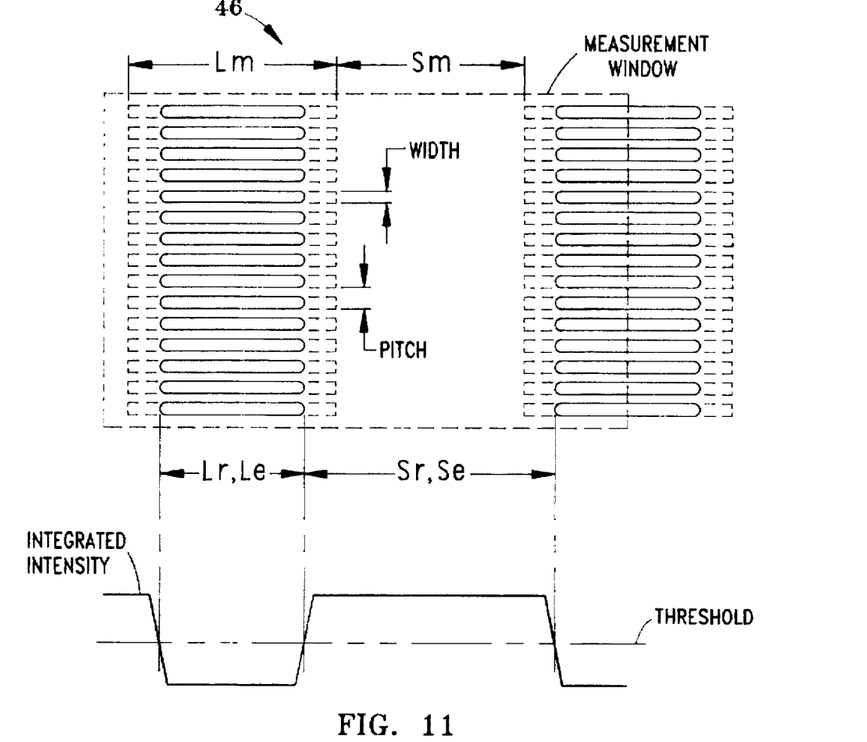
FIG. 11 is a test pattern usable for monitoring process.

An example of a test pattern layout that has been developed to be used in the practice of the invention is shown in FIG. 11. The basic components of the test pattern 46 are two line-space arrays separated by a gap, where the length ($L_m$) of the array elements and the separation or gap ($S_m$) between the two arrays must be within the resolution limit of the optical measurement system being used. Typically, optical measurement systems have resolution capabilities of greater than about 1 µm and, typically, $L_m=S_m=2$ µm.

The width and pitch (width+space) of the elements of the test pattern 46 are designed to be less than or equal to those of the most critical features of the product. The more aggressive the product ground rules, the smaller the width and pitch of the individual elements. As a specific example, in a state-of-the-art semiconductor product having a 0.55 µm pitch and a minimum width of 0.25 µm on its pattern levels, two 15 element arrays were used as a test pattern. The arrays were comprised of 2 µm long elements, with a gap between arrays of 2 µm. The relative size and tone of the lines and spaces, and the tone of the surrounding area, was adapted to the tone and ground rule of the particular device level pattern being printed. Four combinations were used, depending on level:

1) 0.25 µm wide chrome lines spaced 0.3 µm apart in a clear area.
2) 0.3 µm wide chrome lines spaced 0.25 µm apart in a clear area.
3) 0.25 µm wide clear lines spaced 0.3 µm apart in a chrome area.
4) 0.3 µm wide clear lines spaced 0.25 µm apart in a chrome area.

Figure 13:
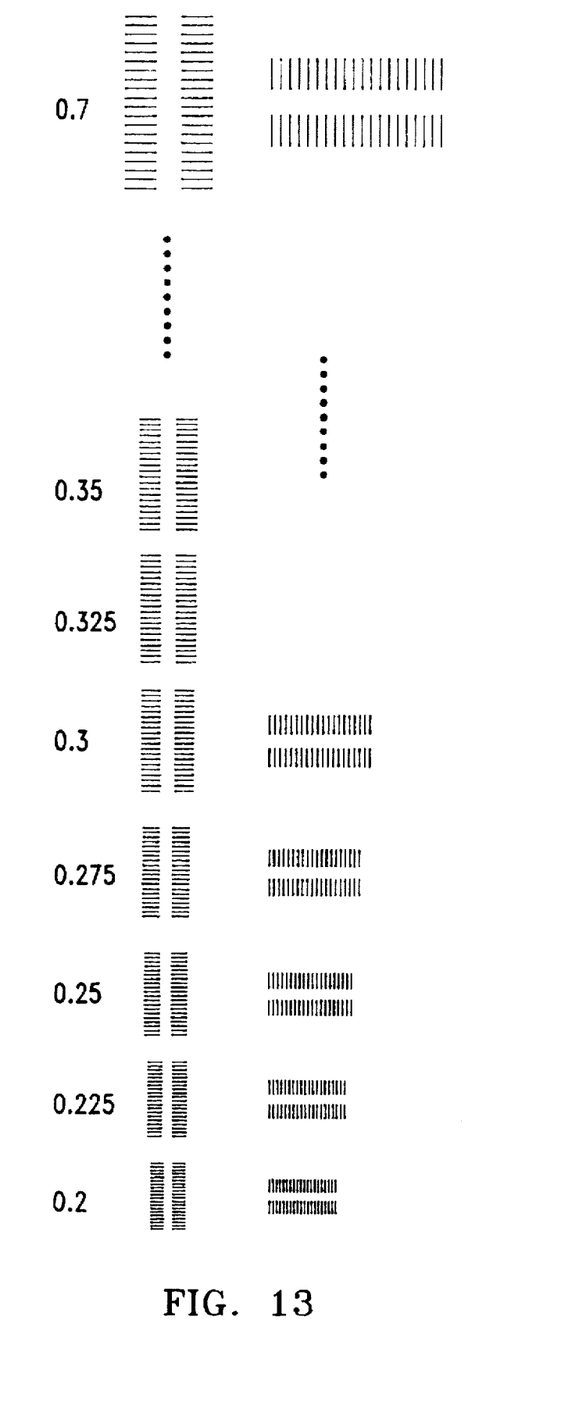
FIG. 13 is a test pattern comprising arrays of varying minimum features usable for process characterization.

The test pattern 46 was placed in both horizontal and vertical orientations at each location as shown in the test pattern 40 of FIG. 10 and also as shown in the test pattern of FIG. 13. The overall pattern size, including surrounding area was less than 20 µm×20 µm. Test patterns of varying feature size such as shown in FIG. 13 can be used to characterize process conditions, as they can provide process information simultaneously on different feature sizes.

As technology advances and smaller line widths and spaces can be printed, the lower limits on the element width and spacing may be reduced. However, the element length must be kept relatively large compared to the resolution limit of optical measurement systems. After the photoresist is developed, two measurements are performed on the length of the test pattern elements. Since the length is well resolved by an optical microscope, the specific means of measurement can be an optical tool, provided the measurement window is set to average over many elements of the test pattern array. The integrated intensity of the detected image is modulated by the pattern, such that the average end of the pattern elements can be located. The means of location can be a simple threshold technique, or a more sophisticated technique of fitting an a priori function to the detected image.

The two measurements of the resist image are 1) the average element length ($L_r$) in the pattern array, and 2) the average separation ($S_r$) between the two arrays. Given the corresponding mask values ($L_m, S_m$) the resist image bias ($B_r$) of the element length can be calculated by the average change in length and space dimensions of the array:

$$B_r=\{(L_r-S_r)-(L_m-S_m)\}/2 \qquad (1)$$

The measurements ($L_r$, $S_r$) also provide an automated means of monitoring the measurement precision ($P_r$). The pitch of the length and separation should be constant and equal in the mask and the resist printed. Therefore the term $P_r$ is defined as:

$$Pr=\{(L_r+S_r)-(L_m+S_m)\}/2 \qquad (2)$$

can be measured and calculated to check the integrity of measurement. Under ideal conditions $P_r$ is independent of $B_r$ and equal to zero. For good measurements, the range of $P_r$ should not exceed the measurement precision of the optical metrology tool, typically 10–20 nm. The value of $P_r$ determined from equation (2) is used as a criterion for culling bad measurements; e.g., those ($L_r$, $S_r$) for which $|P_r|>20$ nm are culled.

An important routine application of metrology measurement in manufacturing is to determine if a wafer needs to be reworked through the lithography process. If the features exceed a certain bias or are not resolved, it is more economical to rework the wafer at this point. This can be achieved as follows: The $B_r$ determined by measurement is compared to an a priori target resist image bias ($T_r$). $T_r$ is defined as the resist image bias that ensures optimum device performance. The deviation of measured resist image bias from target is defined as:

$$D_r = B_r - T_r \qquad (3)$$

This is used to monitor and control the resist imaging process. For a particular set of wafers (commonly referred to as a lot) measured, $D_r$ is the basis for deciding whether or not to move the lot to the next process.

If the mean and/or variation of $D_r$ over a lot of product wafers exceeds an acceptable tolerance (one that guarantees good device yield), the resist image "Fails" and the wafer(s) must be reworked in accordance with block 38 of FIG. 9. Rework entails stripping the resist, recoating and re-exposing the wafer(s) at a corrected dose. The dose correction is proportional to the mean of $D_r$. If $D_r$ is within an acceptable tolerance, the resist image "Passes", and the wafer(s) move on to the next process step.

As successive wafer lots are processed, statistical analysis applied to the within wafer, wafer-to-wafer and lot-to-lot variation of $D_r$, enables the dynamic feedback of dose corrections to the exposure tool and the automatic flagging of process changes. For example, dose corrections proportional to a running average of Dr over multiple wafer lots can be fed back to the exposure tool in order to keep the dose synchronized with process variations affecting $D_r$.

At block 26, the next process step is typically an etch, in which the resist pattern is transferred to the underlying wafer. The etch step typically introduces an additional bias. Consequently, following the removal of all remaining resist, another measurement at block 28 is performed to ensure that the etched image is within acceptable tolerances.

In accordance with the invention, in a manner analogous to the resist image, the etched image ($L_e$, $S_e$) is measured on an optical tool, and the etch bias ($B_e$) and measurement precision ($P_e$) are defined as:

$$B_e = \{(L_e - S_e) - (L_m - S_m)\}/2 \qquad (4)$$

$$P_e = \{(L_e + S_e) - (L_m + S_m)\}/2 \qquad (5)$$

The bias of the etch relative to the resist ($B_x$) is also given by $$B_x = B_e - B_r \qquad (6)$$

Thus by successive measurement of the test site after resist image and after etching process one can determine the etch process bias.

At block 30, as in the case of the resist image, the measured etch bias ($B_e$) is compared to an a priori target etch image bias ($T_e$). Te is defined as the etch image bias that ensures optimum device performance. This target may differ from that of the resist image due to a the relative bias inherent in the resist/etch process ($B_{xt}$). Under ideal conditions the targets ($T_e$, $T_r$) differ by $B_x$. If the deviation of measured etch bias from target ($B_e - T_e$) exceeds an acceptable tolerance (one that guarantees good device yield), the etch image "Fails" and the wafer(s) must scrapped (rework is not possible post-etch).

As indicated at block 32, repeated etch image fails may indicate a need to adjust the resist CD target due to a shift in the resist/etch bias.

If the deviation of $B_e - T_e$ is within an acceptable tolerance, the etch image "Passes", and the wafer(s) move on to the next process step.

Figure 12:
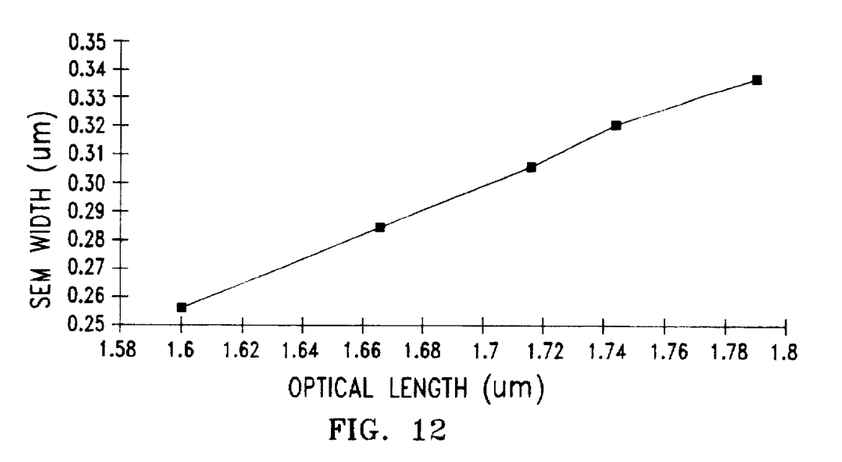
FIG. 12 is a plot of width of an array element measured on an SEM, against the corresponding array length measured on an optical metrology tool.

In summary, the invention enables the monitoring and control of product through accurate measurement of bias of a minimum feature and its distribution in a manufacturing wafer lot by use of unique test patterns at both resist image and etch image processing steps of each device level. The invention enables the use of metrology tools to measure and monitor designs whose minimum features are below the capability of the metrology tools. In specific, optical measurement tools can be used. For example, the variation in the minimum feature (width) can be inferred from the optically measured variation in the length. The relationship between the length and width regime can be characterized over the width regime of interest. FIG. 12 shows the characteristic relationship between the width (measured top down on an Opal SEM) of an element of a test pattern such as shown in FIG. 11, and the average length of the full array of elements (measured on a Biorad Optical Metrology system). In this case, the array elements were 0.3 μm×2 μm openings in resist at a 0.55 μm pitch. The variation in dimensions was achieved by changing exposure dose at a fixed focus. Over the range of variation, the relationship of length to width is linear. As noted earlier, the length changes more rapidly than the width. The sensitivity in this case is approximately 2:1, so that a 100 nm change in the length corresponds to a 50 nm change in the width.

In addition to the above-described dispositioning of product wafers, another application of the invention is for in-depth characterization of the resist/etch imaging process. In this case, the sampling of test patterns, in different pattern densities and orientations, over the image field and wafer, must be sufficient to determine the within field and across wafer image variation. An appropriate distribution of test patterns may not be possible on a product mask, due to the area occupied by the product device. In some cases, therefore, test masks devoted to arrays of test patterns may be needed. As shown earlier by data in FIGS. 4A, 4B, and 5, the length measurement using the test pattern described in the present invention will provide equal or more sensitivity to monitoring and controlling the expose, develop and focus conditions at the minimum feature width of the design. Thus the lithographic process can be easily monitored and adjusted using routine metrology tools than heretofore possible.

Another application of the present invention is in exposure tool/process development and determine its capability in terms of the minimum feature size or minimum bias that the tool/process can be extended to. For this application a test pattern having arrays with line width and space of patterns distributed about the anticipated tool/process capability can be used. Using a test pattern such as shown in FIG. 13, a test site suitable for use with an exposure tool/process that is used with 0.35 μm minimum feature can be tested for extendibility to smaller feature size. The extendibility study can involve hardware change such as a different lens with a different numerical aperture a different resist or a different software for focussing etc. By measuring the image shortening and using the bias of the length change as a function of the minimum feature of a specific array, the bias of the minimum feature can be calculated and compared to the target values for use. Similarly, the benefit of a hardware or process change can be quantified.

The method of the invention provides several advantages. First, better centering of the lithographic and etch process can be achieved, since the line lengths being measured according to the invention are more sensitive to process (exposure, focus, etch) variation than the widths measured according to conventional techniques. Second, the invention enables measurement at lower metrology tool resolution without loss of precision, since the element length and the number of elements comprising the test pattern array can be kept within the resolution capability of the tool, independent of the element width. In fact, there is no measurement limit on the minimum width of the element that can be monitored according to the invention. As the element width decreases, a greater number of pattern elements can be averaged at a given magnification, leading to an improvement in measurement precision. Third, the invention enables optical metrology to replace scanning electron (SEM) metrology in the routine resist/etch image dispositioning of product wafers. Optical measurement provides major advantages in speed, automation and equipment cost. The improved speed and automation of optical measurement relative to SEM measurement enables more measurements per wafer and, consequently a more thorough in-line characterization of the imaging process. Finally, the inherent redundancy of the technique enables the automated culling of bad measurements due to metrology tool failures, processing and test pattern defects.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A test pattern for monitoring a lithographic process on a substrate comprising; at least two arrays, each of said array consisting of a group of parallel elements having a nominal width and a nominal length; said elements in the array disposed such that their length parallel and adjacent to each other and separated by a nominal spacing; the nominal width and nominal spacing of the elements being less than or equal to one micron; said elements in the array having the nominal length greater than one micron sufficient for measurement by a metrology tool; said arrays disposed adjacent to each other such that length of the elements lie in the same direction; and said arrays separated by a nominal distance greater than one micron similar to the nominal length of the elements.

2. A test pattern for monitoring a lithographic process on a substrate comprising: a plurality of arrays, each of said arrays consisting of a group of parallel elements having a nominal width and a nominal length; said elements in the array disposed such that their length parallel and adjacent to each other and separated by a nominal spacing; the nominal width and nominal spacing of the elements being unique and less than or equal to one micron; said elements in the array having the nominal length greater than one micron, sufficient for measurement by a metrology tool; said arrays disposed adjacent to each other such that their length lie in the same direction and separated by a nominal distance greater than one micron similar to the nominal legth of the elements.

3. A test pattern for monitoring a lithographic process, comprising: a plurality of pairs of arrays, wherein each of the pair of arrays consists of a group of elements having a nominal width and a nominal length; said elements disposed with their length parallel and adjacent to each other and operated by a nominal spacing; the nominal width and nominal spacing in each of the pair of arrays being unique and less than or equal to one micron; said elements in the array having the nominal length greater than one micron sufficient for measurement by a metrology tool; each of said pairs of arrays disposed adjacent to each other such that length of the elements lie in same direction, and separated by a nominal distance greater than one micron similar to the nominal length of the elements.

* * * * *